United States Patent [19]
Bechevet et al.

[11] Patent Number: 4,906,821
[45] Date of Patent: Mar. 6, 1990

[54] RESISTOR FOR THE TREATMENT OF MATERIALS

[75] Inventors: Bernard Bechevet, Claix; Claude Calvat, Saint Egreve; Philippe Hugot, Saint Ismier; Gérard Basset, Saint Egreve, all of France

[73] Assignee: Commissariat a l'Energie Atomique, Paris, France

[21] Appl. No.: 217,960

[22] Filed: Jul. 12, 1988

Related U.S. Application Data

[63] Continuation of Ser. No. 908,824, Sep. 18, 1986, abandoned.

[30] Foreign Application Priority Data

Sep. 18, 1985 [FR] France .............................. 85 13821

[51] Int. Cl.⁴ .......................... H05B 3/06; H05B 3/10
[52] U.S. Cl. .................................. 219/521; 219/553; 338/333
[58] Field of Search .................. 219/521, 552, 553; 338/333, 316

[56] References Cited

U.S. PATENT DOCUMENTS 3,351,742  11/1967  Harris .................... 219/552
3,792,233   2/1974  Anthony et al. ......... 219/553
4,152,572   5/1979  Noda et al. .............. 219/118

FOREIGN PATENT DOCUMENTS 2138232   1/1973  France .
2373206  12/1976  France .
2441004   6/1980  France .
1142935   2/1969  United Kingdom .
2109911   6/1983  United Kingdom .

Primary Examiner—Teresa J. Walberg
Assistant Examiner—Marvin Lateef
Attorney, Agent, or Firm—Nutter, McClennen & Fish

[57] ABSTRACT

A resistor for the treatment of materials, such as for the production of monocrystals by the planar resistor method includes an electrically conductive thin plate having a zone with a plurality of holes. With respect to an electric current flowing in the plate substantially parallel to its faces, the plate has lower electrical resistance in a peripheral area of said zone than in the central portion thereof.

9 Claims, 2 Drawing Sheets

RESISTOR FOR THE TREATMENT OF MATERIALS

RELATED APPLICATION

This application is a continuation of Ser. No. 908,824, filed Sept. 18, 1986, now abandoned.

BACKGROUND OF THE INVENTION

The present invention relates to a resistor for the treatment of materials.

It is known that a resistor comprises a thin electrically conductive plate having an area with a plurality of holes and which is used for treating materials and, in particular, for producing a monocrystal from a polycrystalline material or for purifying a material by zone melting.

Such resistors are already known from French patent Nos. 2 067 923, and 2 251 368 as well as from British patent No. 1 059 916, but the resistors described therein do not make it possible to appropriately treat the materials and, in particular, do not make it possible to produce crystals with large diameters, great lengths and of good qualities.

SUMMARY OF THE INVENTION

The present invention aims at obviating this disadvantage. It relates to a resistor for the treatment of materials, which comprises a thin electrically conductive plate, having a zone with a plurality of holes, wherein with respect to an electric current propagating in said plate, which is substantially parallel to the faces of said plate, has a lower electrical resistance in a peripheral area of said zone than in the central part thereof.

The electrical resistance inhomogeneity of the plate has the effect of increasing the current density and therefore the power given off, as well as the temperature in said area (compared with the central part of the zone). The thermal gradient produced by the plate when it is heated takes it possible to better treat material than in the aforementioned prior art. In particular, the invention makes it possible to produce larger diameter, longer and better quality crystals, said three parameters being linked with the thermal gradient in question.

According to an embodiment of the resistor according to the invention, the plate has a greater thickness in said area than in the central part of the zone.

In a special embodiment, the plate comprises a first thin foil and a second thin foil in the form of a ring and joined to the first foil, the latter having holes in the part defined by the periphery of the ring and those holes located in the part covered by the ring also traverse the latter.

Preferably the ring is provided with two extensions extending along the same diameter of the ring on either side thereof and having a length, considered transversely to said diameter, which decreases on passing towards the ring and which are also joined to the first foil, the plate being heated by an electric current flowing in the plate and substantially in a direction passing from one extension to the next.

This particular form of the extensions makes it possible to greatly reduce, or even eliminate, overheating of the edge of the resistor.

According to another special embodiment of the resistor according to the invention, the plate has a greater material density in said area than in the central part of the zone.

For this purpose, in a first constructional embodiment, the size of the holes is greater in the central part of said zone than in said area and in a second constructional embodiment the surface density of the holes is greater in the central part of said zone than in said area.

Obviously the first and second constructional embodiments can be combined. For example, The size of the holes and/or the surface density thereof can decrease from the center to the periphery of the zone.

Finally, with respect to the other special embodiment, the plate can be provided over at least one of its faces with opposite thermal reflectors with respect to said zone and adjacent thereto, the plate being heated by the electric current flowing in the plate substantially in a direction from one reflector to the other.

Thus, the reflectors may only be present on a single upper or lower face of the plate. They can also be present on both faces of the plate, which is desirable for rendering the temperatures uniform, in the case of producing large diameter crystal ingots.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
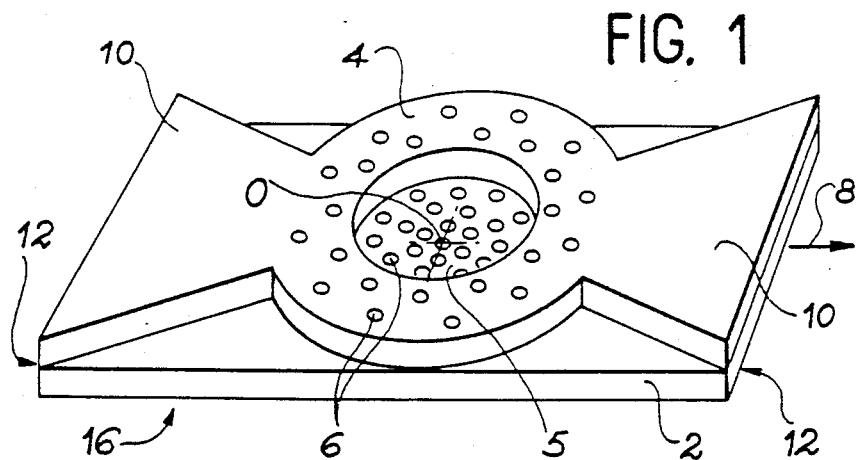
FIG. 1 A diagrammatic view of an embodiment of the resistor according to the invention.

FIG. 1 diagrammatically shows a special embodiment of the resistor according to the invention. This embodiment comprises a first elongated, electrically conductive thin foil 2, which e.g. has a rectangular shape, as well as a second ring-shaped, electrically conductive foil 4, which is joined to the first foil 2 and placed in the center thereof. A plurality of holes 6 are distributed over the ring 4 and pass through the latter, as well as that part of the first foil 2 below the ring. Part 5 of the first foil 2 surrounded by ring 4 is also traversed by holes 6. Preferably, the holes 6 have a regular distribution.

The resistor shown in FIG. 1 is heated by an electric current passing through said resistor along the length of foil or plate 2, in the direction indicated by arrow 8 in FIG. 1. In a preferred embodiment in order to avoid any overheating of the resistor edges, ring 4 is provided with two extensions 10 (in the form of electrically conductive thin films), which extend on either side of the ring, in the longitudinal direction of the first foil 2 and which have a width, considered transversely to said direction, which decreases on passing towards the ring, each extension 10 extending up to the edge 12 of the first plate 2. Each of these extensions e.g. has the shape of an isosceles trapezium.

The assembly constituted by ring 4 and extensions 10 is e.g. fixed to the first plate 2 by welding. The thickness of ring 4 and of each extension 10 are e.g. equal to the thickness of plate 2. Plate 2, as well as assembly 4,10 are e.g. made from platinum.

The resistor of FIG. 1 is e.g. usable for producing a $LiNbO_3$ monocrystal, whose melting temperature $T_F$ is equal to 1250° C. The monocrystal is produced by means of a cylindrical charge 14 (FIG. 2), whose diameter is at the most equal to the diameter of ring 4 and which is located above resistor 16 shown in FIG. 1, the axis of the charge passing through the center O of the ring and by means of a not shown nucleus, located below the resistor. The latter is raised to a temperature slightly above $T_F$, while charge 14 and the nucleus, which are initially in contact with the resistor and consequently melt in contact therewith, are lowered in accordance with the axis of the ring. Thus, monocrystal 18 forms below resistor 16. The melting interface 20, located just above the resistor and the growth interface 22 located slightly below said resistor are substantially planar to the resistor.

In an indicative and in no way limitative manner, resistor 16 has a width of 40 mm and a length of 120 mm, the thickness of the first foil 2 and the second foil 4, as well as the extensions 10 thereof being 0.1 mm, the internal diameter of ring 4 being 20 mm and the external diameter of ring 4 being 40 mm. The holes have a diameter of 1 mm and are regularly distributed in two perpendicular directions, with a spacing of 3 mm, over the entire surface (crystallization zone) defined by the circumference of the ring and of external diameter 40 mm.

The thus formed resistor makes it possible to produce $LiNbO_3$ monocrystals with a diameter of approximately 20 to 40 mm and a length of approximately 30 to 70 mm, said monocrystals being oriented in crystal direction z.

Figure 3:
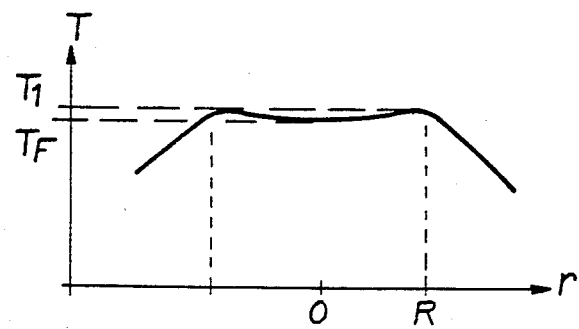
FIG. 3 The curve of the radial temperature variations in the crystallization zone, level with the plate, during pulling.

The starting charge e.g. has a diameter of 28 mm and can be constituted by a $LiNbO_3$ powder, which is isostatically compressed and densified to approximately 65%. FIG. 3 shows the temperature variations T at resistor 16, as a function of the distance r in the center O of ring 4, whose external radius is designated R. FIG. 3 shows that the radial thermal gradient is substantially zero in the crystallization zone of diameter 2R, the maximum temperature $T_1$ in said zone exceeding $T_F$ by approximately 20° C. The maximum current intensity flowing in the resistor is approximately 200 A, for a voltage of approximately 1 to 2 V, established between the ends 12 of said resistor.

Figure 4:
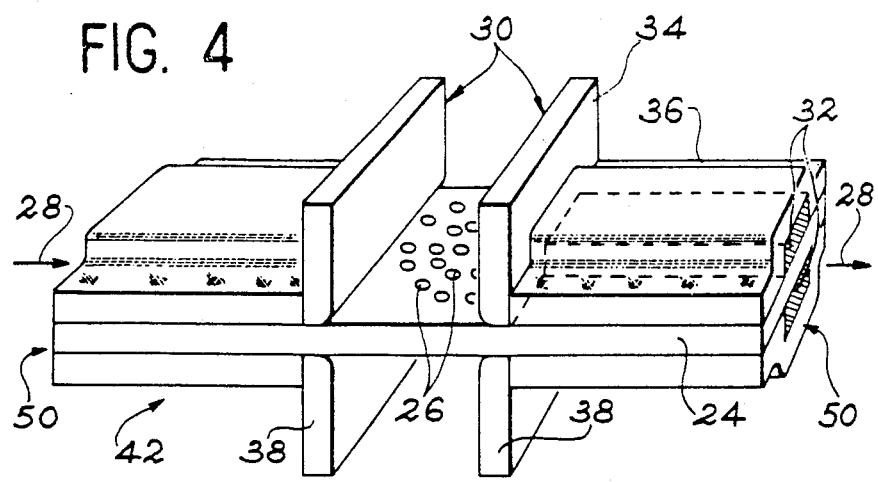
FIG. 4 A diagrammatic view of another embodiment of the resistor according to the invention.

FIG. 4 diagrammatically shows another embodiment of the resistor according to the invention and which can, in particular, be used for producing monocrystal $Nd_3Ga_5O_{12}$, $Sm_3Ga_5O_{12}$ or $Gd_3Ga_5O_{12}$, the high melting temperature of these materials making it desirable to use reflectors for the production thereof and reference will be made thereto hereinafter.

. The resistor diagrammatically shown in FIG. 4 comprises an elongated thin foil 24, which is e.g. rectangular and also electrically conductive. This foil has a plurality of holes 26, which are preferably regularly distributed over a circular zone of the central part of foil 24. The resistor of FIG. 4 is to be heated by an electric current flowing in the length direction of foil 24, in accordance with the arrows 28 of FIG. 4.

Two thermal reflectors 30, made from an electrically conductive material, extend on one face of foil 24 on either side of the zone of holes 26. Each reflector 30 is e.g. constituted by a plate which is bent at right angles and whereof one side 32, which is not as wide as foil 24, rests against the latter, while the other side 34 closer to the zone of holes 26, rises perpendicularly to foil 24 over the entire width thereof. Reflector 30 is fixed to foil 24 by means of a metal sheet 36 covering side 32 and whose edges rest against foil 24. Sheet 36 is also fixed to side 32 and foil 24, e.g. by spot welding.

In a purely indicative and non-limitative manner, foil 24 and each reflector 30 are made from iridium and each sheet 36 from platinum, which facilitates the welding thereof to reflector 30 and to foil 24. Reflectors 38, identical to reflectors 30, are disposed on the other face of foil 24 symmetrically to reflectors 30.

Figure 5:
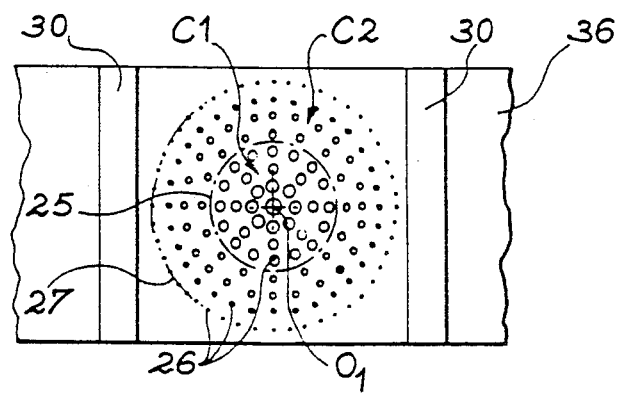
FIG. 5 The distribution of the holes in the resistor shown in FIG. 4.
Figure 6:
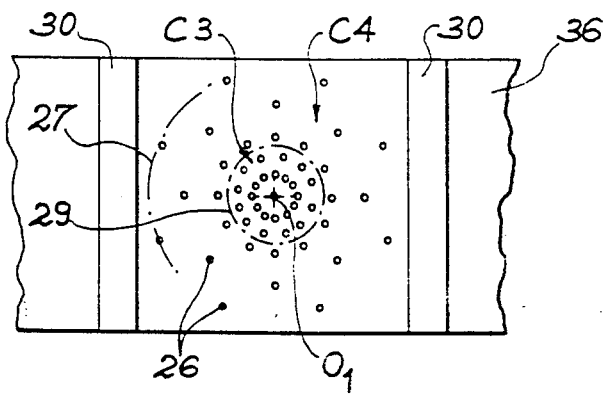
FIG. 6 Another possible distribution for these holes.

The holes 26 can be distributed symmetrically with respect to centre $O_1$ of the zone having these holes. The diameter of holes 26 can progressively decrease from the center $0_1$ to the peripherary of the zone of the holes 26 (FIG. 5) or holes 26 can all have the same diameter and a surface density decreasing from center $0_1$ (FIG. 6).

It is possible to produce holes having a given diameter $D_1$, which are arranged in accordance with a given spacing $P_1$, within the surface $C_1$ of a circle 25 of center $O_1$. On the surface $C_2$ of the ring between circle 27, defining the zone of the holes, and circle 25, holes of diameter $D_2$ smaller than $D_1$ are arranged with a spacing $P_2$ smaller than $P_1$ (cf. FIG. 5). For example, the ring has an external diameter equal to double its internal diameter.

It is also possible to produce holes with a given diameter $D_3$ arranged in accordance with a given spacing $P_3$ within the surface $C_3$ of a circle 29 of center $O_1$. On the surface $C_4$ of the ring between circles 27 and 29, the holes of diameter $D_3$ are arranged with a spacing $P_4$, which exceeds $p_3$(cf. FIG. 6).

Figure 2:
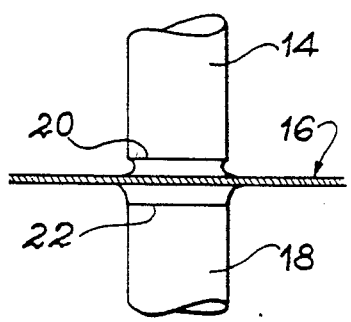
FIG. 2 Diagrammatically, the pulling of a monocrystal by means of said resistor.
Figure 7:
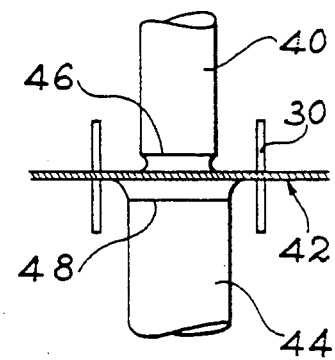
FIG. 7 Diagrammatically the pulling of a monocrystal by means of the resistor shown in FIG. 4.

The resistor of FIG. 4 can be used for producing $Nd_3Ga_5O_{12}$ monocrystals, whose melting temperature is 1515° C. Production takes place as indicated in the description of FIG. 2 using a charge 40 (FIG. 7), which passes through the resistor 42 described with reference to FIG. 4 and raised to an appropriate temperature slightly above the melting temperature, in order to give a monocrystal 44. By means of resistor 42, the melting interface 47 and the growth interface 48 are substantially planar.

In a purely indicative and in no way limitative manner, the width of the resistor is 40 mm and the length thereof 120 mm. The thickness of foil 24 is 0.15 mm, the thickness of each plate 30 0.15 mm and the thickness of sheet is 36 0.1 mm. The total length of parts 32 and 34 is 42 mm and the height of side 34 of plate 30, constituting the actual reflector, is 7 mm. The width of plate 30 is 40 mm on side 34 and 20 mm on side 32. The width of sheet 36 is 40 mm and the length of this sheet 36 is 41 mm. Holes 26 have a diameter of 1.5 mm and are distributed with a spacing of 3 mm on the surface of a circle of center $O_1$ and diameter 20 mm, while over the rest of the zone, the holes 26 have a diameter of 1 mm and a reciprocal spacing of 3 mm.

Starting with an initial cylindrical charge with a diameter of 18 mm and constituted by an isostatically compressed mixture of $Nd_2O_3, Gd_2O_3$ and for an electric current of intensity 350A and a voltage between 1 and 3V between the ends 50 of resistor 42, it is possible to obtain $Nd_3Ga_5O_{12}$ monocrystals with a diameter of 25 mm and a length of 30 mm with a crystal orientation of <111>.

In place of iridium or platinum, it would be possible to use nickel, stainless steel or graphite for producing foils 2, 4, 10 and 24.

What is claimed is:

1. A resistor for the treatment of materials especially for the production of monocrystalline material and for purifying material by zone melting, said resistor comprising an electrically conductive thin heating plate having a heating surface for exposure to the material to be treated, a second surface opposite the heating surface and a crystallization zone encompassing a selected area of said plate and extending between said surfaces, means defining a plurality of through-holes extending from said heating surface to said second surface in said zone for passage through said plate in said zone of material melted by contact with said heating surface when said plate is heated electrically, said holes being positioned in said zone so that the plate, with respect to an electrical current flowing in said plate parallel to said surfaces, has an electrical resistance which is lower in a peripheral area of said zone than in the central portion thereof.

2. A resistor according to claim 1, wherein the plate has a greater thickness in said area than in the central portion of the zone.

3. A resistor according to claim 2, wherein the plate comprises a first thin foil and a second ring-shaped thin foil joined to the first foil, wherein said first foil has holes in the portion defined by the circumference of the second foil and wherein those holes located in the portion covered by the second foil also traverse the latter.

4. A resistor according to claim 3, wherein the second foil is provided with two extensions extending along a same second foil diameter on either side thereof, said extensions having a width, considered transversely to said diameter, which decreases on passing towards the ring and said extensions also being joined to the first foil, the plate being heated by an electric current flowing in the plate substantially in a direction passing from one extension to the other.

5. A resistor according to claim 1, wherein the plate has a greater material density in said area than in the central portion of the zone.

6. A resistor according to claim 5, wherein the size of the holes is greater in the central portion of said zone than in said area.

7. A resistor according to claim 5, wherein the surface density of the holes is greater in the central portion of said zone than in said area.

8. A resistor according to claim 5, wherein the plate is provided, on at least one of its faces, with opposite thermal reflectors with respect to said zone and adjacent thereto, the plate being heated by an electric current flowing in the plate substantially in a direction passing from one reflector to the other.

9. A method of treating a charge of material by zone melting comprising the steps of forming an electrically conductive thin heating plate with a crystallization zone containing a plurality of holes extending between opposite faces of said plate and with an electrical resistance which is lower in a peripheral area of said zone than in the central portion thereof, positioning said charge and a nucleus at said opposite faces of said plate in said zone, passing an electric current through said plate parallel to the faces thereof so as to heat said plate above the melting point of said charge material and displacing the charge and the plate relatively so that the charge material melts upon contact with the plate and passes through the holes in said plate and is subjected to a selected thermal gradient in said zone.

* * * * *